(12) United States Patent
Taghivand et al.

(10) Patent No.: US 8,704,603 B2
(45) Date of Patent: Apr. 22, 2014

(54) LOW POWER WIDEBAND LO USING TUNED INJECTION LOCKED OSCILLATOR

(75) Inventors: Mazhareddin Taghivand, San Diego, CA (US); Jeongsik Yang, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 148 days.

(21) Appl. No.: 13/086,325

(22) Filed: Apr. 13, 2011

(65) Prior Publication Data

US 2012/0262239 A1 Oct. 18, 2012

(51) Int. Cl.
  *H03B 5/12* (2006.01)
  *H03B 27/00* (2006.01)
  *H03L 7/24* (2006.01)
  *H03L 7/06* (2006.01)

(52) U.S. Cl.
  USPC ............ 331/46; 331/55; 331/48; 331/14; 331/51

(58) Field of Classification Search
  USPC ............ 331/46, 48, 50, 51, 55, 172, 117 R, 331/117 FE, 167, 10, 11, 14
  See application file for complete search history.

(56) References Cited

U.S. PATENT DOCUMENTS

| | | | |
|---|---|---|---|
| 6,850,122 B2 * | 2/2005 | Ravi et al. ................. | 331/46 |
| 6,963,249 B2 * | 11/2005 | Devries et al. ................. | 331/47 |
| 7,292,119 B2 * | 11/2007 | Urakawa ................. | 331/179 |
| 7,539,476 B2 * | 5/2009 | Devries et al. ................. | 455/313 |
| 2003/0050029 A1 * | 3/2003 | Kaufmann et al. ........... | 455/260 |
| 2004/0008092 A1 * | 1/2004 | Hajimiri et al. ........... | 331/117 R |
| 2007/0165565 A1 | 7/2007 | Jung et al. | |
| 2009/0042528 A1 | 2/2009 | Pellerano et al. | |
| 2009/0079506 A1 * | 3/2009 | Wu et al. ................. | 331/11 |
| 2010/0085123 A1 * | 4/2010 | Frans et al. ................. | 331/47 |
| 2010/0134158 A1 | 6/2010 | Pignol et al. | |

FOREIGN PATENT DOCUMENTS

WO 2006004471 A1 1/2006

OTHER PUBLICATIONS

International Search Report and Written Opinion—PCT/US2012/033093—ISA/EPO—Feb. 22, 2013.
Taiwan Search Report—TW097134269—TIPO—Mar. 5, 2012.

* cited by examiner

Primary Examiner — Ryan Johnson
(74) Attorney, Agent, or Firm — Kenyon S. Jenckes

(57) ABSTRACT

A tunable Injection-Locked Oscillator (ILO) having a wide locking range is used in a Local Oscillator (LO) of a wideband wireless transceiver to generate differential signals. The ILO includes a resonator with an adjustable natural oscillating frequency. In one example, the ILO is part of a quadrature divider that can lock onto a Phase-Locked Loop (PLL) output signal in a wide frequency band while achieving lower power consumption and lower phase noise than a differential latch type divider. The ILO is tuned by disabling a Voltage-Controlled Oscillator (VCO) from driving the ILO, adjusting the natural oscillating frequency, making a measurement indicative of the natural oscillating frequency, and determining whether the measurement is within a predetermined range. If the measurement is below the predetermined range, capacitances of resonators within the ILO are decreased, whereas if the measurement is above the predetermined range, capacitances of the resonators are increased.

22 Claims, 5 Drawing Sheets

WIRELESS TRANSCEIVER

QUADRATURE DIVIDER
(DIVIDE-BY-TWO)

A MEASUREMENT INDICATIVE OF THE NATURAL
OSCILLATING FREQUENCY

| BAND | CHANNEL | ACCEPTABLE MEASUREMENT COUNT RANGE |
|---|---|---|
| 802.11(a) | 1 | CNTA11-CNTA12 |
| 802.11(a) | 2 | CNTA21-CNTA22 |
| 802.11(a) | ⋮ | ⋮ |
| 802.11(a) | N | CNTAN1-CNTAN2 |
| 802.11(b) | 1 | CNTB11-CNTB12 |
| 802.11(b) | 2 | CNTB21-CNTB22 |
| 802.11(b) | ⋮ | ⋮ |
| 802.11(b) | N | CNTBN1-CNTBN2 |

ILO RESONATOR TUNING TABLE

LOW POWER WIDEBAND LO USING TUNED INJECTION LOCKED OSCILLATOR

BACKGROUND INFORMATION

1. Technical Field

The present disclosure relates to low power wideband local oscillators.

2. Background Information

Wireless transceivers generally use one or more local oscillator circuits to generate signals referred to as Local Oscillator (LO) signals. These LO output signals are used by other circuitry in the transceiver either to upconvert a baseband signal in frequency for transmitting, or to downconvert an RF signal in frequency during receiving. The LO output signals often must involve quadrature signals. A divider circuit is therefore traditionally used to divide down a higher frequency signal by two and thereby to output both an In-Phase (I) LO output signal and a Quadrature-Phase (Q) LO output signal, where the I and Q LO output signals are both at half the frequency of the signal supplied to the divider but where the I and Q signals are ninety degrees out of phase with respect to one another. In a narrowband transceiver, an injection-locked type divider can be used for this purpose of generating the I and Q signals. As compared to a differential latch type divider, the injection-locked divider may exhibit lower power consumption and lower phase noise. The injection-locked divider however has a locking range due to the natural oscillating frequency of a part or parts of the circuit. A reference signal is supplied to a Phase-Locked Loop (PLL) such that the PLL outputs a signal of twice the frequency of the desired quadrature signals. The PLL output signal is tunable. The PLL output signal is made to inject energy into the injection-locked oscillator in such a way that a resonator of the injection-locked oscillator oscillates at the frequency or at a frequency fraction of the input PLL signal. For example, the ILO divider may oscillate at a frequency that is ½, or ⅓, or ¼, etc., of the frequency of the PLL output signal. The result is that the injection locked oscillator outputs I and Q signals of the desired output frequency, where this frequency is tunable by controlling the PLL appropriately.

Using an injection locked oscillator to perform frequency division works well in many applications, but using the injection locked oscillator has a drawback in that the oscillator generally can only lock to signals in a narrow frequency band. Locking of the injection locked oscillator is limited in this way because the oscillator has a high Q resonator. Where the device that uses the I and Q LO output signals is the receiver and/or transmitter within a wideband transceiver, such an injection locked oscillator cannot lock at all the PLL signal frequencies required. This is especially true when a large population of devices is considered, over temperature, and process and supply variations that the transceivers will experience. There are techniques for making an injection locked oscillator type divider more adaptable, but these techniques degrade divider performance. Accordingly, in wideband transceivers a differential latch type divider is generally employed to generate the LO output signals. However, a differential latch divider circuit has a higher power consumption and phase noise than an injection locked oscillator even though it can divide down the PLL signal over a wider frequency range.

SUMMARY

A Local Oscillator (LO) of a wideband wireless transceiver generates differential quadrature LO output signals. The LO includes a Phase-Locked Loop (PLL) that drives a quadrature divider. The quadrature divider includes a tunable Injection-Locked Oscillator (ILO) that locks onto the PLL output signal, and divides down the frequency of the PLL output signal by two (or three, or four, etc.), thereby generating both an In-Phase (I) LO output signal and a Quadrature-Phase (Q) LO output signal. Depending on the frequency band and channel in which the wideband wireless transceiver is to communicate, the natural oscillating frequency of the ILO is set to be a predetermined fraction (for example, one half, one third, one quarter, etc.) of the frequency of the PLL output signal.

The ILO includes a pair of resonators where each resonator has a natural oscillating frequency that can be adjusted by a multi-bit digital control signal. The multi-bit digital control signal is used to set the natural oscillating frequency of the ILO to be an appropriate fraction of the frequency of the PLL output signal. By setting the natural oscillating frequency in this way, the ILO is tunable over a wide frequency range. The ILO can therefore lock onto PLL output signals over a wide frequency range. The quadrature divider exhibits lower power consumption and lower phase noise than if the quadrature divider were of a differential latch type. Despite lower power consumption and lower phase noise, the ILO can lock onto a wide range of PLL output frequencies required for operation of the wideband wireless transceiver.

In one specific example, the tunable ILO includes a first resonator and a second resonator. Each resonator has a variable capacitor element. A natural oscillating frequency of the tunable ILO is adjusted by receiving a multi-bit digital control signal that adjusts the capacitances of the variable capacitor elements, thereby adjusting the natural oscillating frequencies of the resonators and of the ILO. Each variable capacitor element includes a set of capacitance elements. Each capacitance element includes two capacitors and a switch. The switch is controlled by a corresponding bit of the multi-bit digital control signal. By appropriate control of the multi-bit digital control signal, selected ones of the capacitance elements are selectively switched in or switched out of the variable capacitor element, thereby setting the overall capacitance of the variable capacitor element.

The natural oscillating frequency of the tunable ILO is typically adjusted during operation of the wideband wireless transceiver to be half the frequency of the PLL output signal injected into the ILO. In order to perform this adjustment, a processor of the wireless wideband transceiver first determines an impending change in frequency of the LO output signal. The processor may, for example, use band and channel information to look up an acceptable range of measurement values. Next, a Voltage-Controlled Oscillator (VCO) of the PLL that normally drives the ILO is disabled from driving the ILO. After the VCO is disabled, the natural oscillating frequency of the ILO is adjusted so that the natural oscillating frequency of the resonators within the ILO will be closer to the natural oscillating frequency required for the operation band and channel selected for communication by the wideband wireless transceiver. In one example, this adjustment is performed by setting the value of the multi-bit digital control signal supplied to variable capacitance elements in the resonators in the ILO. In another example, this adjustment is performed by setting an analog control voltage going to varactors in the resonators in the ILO. Next, a measurement is made that is indicative of the natural oscillating frequency of the resonators. If the measurement is not within the acceptable range, then the adjustment and measurement process is iteratively repeated until the natural oscillating frequency is within the acceptable range. Once the natural oscillating frequency as measured is determined to be within the acceptable range, then the VCO is enabled so that the VCO again drives the ILO.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 1:
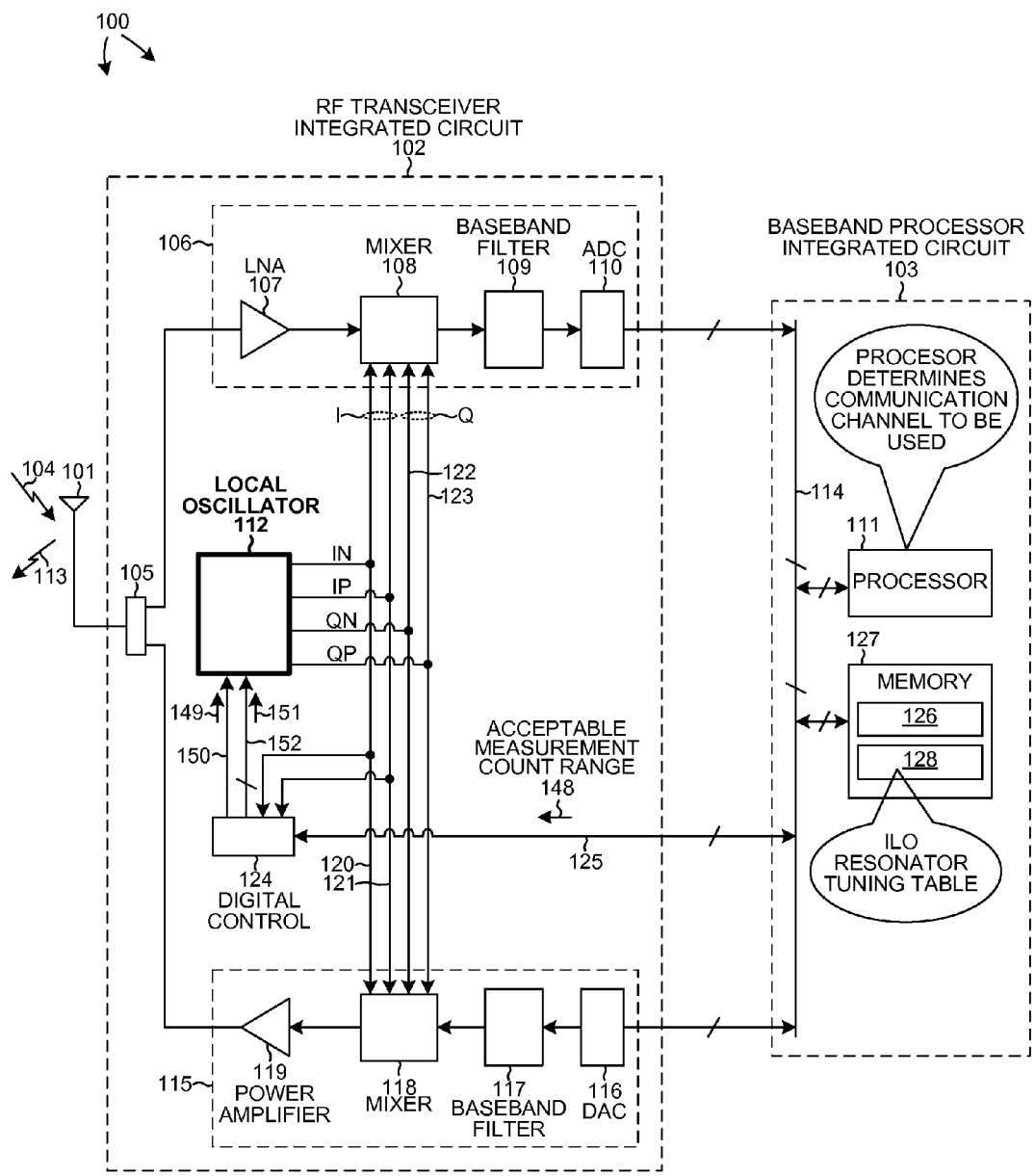
FIG. 1 is a simplified diagram of a wireless transceiver 100 in accordance with one aspect.

FIG. 1 is a simplified diagram of a wireless transceiver 100 in accordance with one aspect. In this case, the wireless transceiver 100 is a Wi-Fi ("wireless fidelity") transceiver for wireless communication. Wi-Fi is a wireless technology standard for wireless local area network ("WLAN") and wireless devices, and refers to certain types of WLAN that operate in compliance with specifications in the IEEE 802.11 family. The IEEE 802.11 family includes 802.11(a), 802.11(b), 802.11(n), 802.11(ad), 802.11(ac), and 802.11(g), among others, and specifies an over-the-air interface for wireless communication. Transceiver 100 includes, among other parts not illustrated, an antenna 101, a Radio Frequency (RF) transceiver integrated circuit 102, and a baseband processor integrated circuit 103. The transceiver 100 can receive a signal 104 on antenna 101. The signal 104 passes from the antenna 101 through an antenna switch 105, and then to a receive chain 106. The receive chain 106 includes a Low Noise Amplifier (LNA) 107 that amplifies the signal and a mixer 108 that downconverts the signal. The downconverted signal is filtered by baseband filter 109 and converted into digital form by Analog-to-Digital Converter (ADC) 110 such that the resulting digitized information passes to the baseband processor integrated circuit 103 for further processing by processor 111. In some examples, ADC 110 is a part of the baseband processor integrated circuit 103. How the mixer 108 of the receive chain 106 downconverts the signal is controlled by local oscillator 112. In the event the transceiver 100 is transmitting a signal, information to be transmitted is generated in digital form by processor 111, and is communicated by a bus mechanism 114 to a transmit chain 115 in the RF transceiver integrated circuit 102. The transmit chain 115 includes a Digital-to-Analog Converter (DAC) 116 that converts the digital information into an analog information. The analog information is filtered by baseband filter 117 and is then upconverted by mixer 118. The upconverted signal is then amplified by power amplifier 119, passes through antenna switch 105 and is transmitted from antenna 101 in the form of wireless communication 113. In some examples, DAC 116 is a part of the baseband processor integrated circuit 103. How the mixer 118 of the transmit chain 115 upconverts the signal is controlled by local oscillator 112. In this case, the local oscillator 112 supplies quadrature signals in the form of an In-Phase (I) differential signal on conductors 120 and 121, and a Quadrature-Phase (Q) differential signal on conductors 122 and 123. The Q differential signal is ninety degrees out of phase with respect to the I differential signal. In addition, as described below, the local oscillator 112 involves an Injection-Locked Oscillator (ILO) 112. This ILO is calibrated or tuned by an amount of digital control circuitry 124. The processor 111 communicates with and controls the digital control circuitry 124 via bus mechanism 114 and digital control conductors 125. The processor 111 of the baseband processor integrated circuit 103 can access and execute programs of processor executable instructions 126 that are stored in memory 127. In addition, the memory 127 stores an ILO tuning table 128 as described below.

In one example, the wireless transceiver 100 of FIG. 1 is a Wi-Fi transceiver that can operate either in the 802.11(a) band or in the 802.11(b) band. The 802.11(a) band extends from approximately 4.8 GHz to 5.8 GHz, whereas the 802.11(b) band extends from approximately 2.412 GHz to 2.484 GHz. Within each of these bands the wireless transceiver 100 may be communicating wireless signals over a selected one of multiple channels, where each channel is separated from the nearest adjacent channel by 20 MHz. The baseband processor integrated circuit 103 is aware of and determines which communication channel will be used, and controls the local oscillator 112 of the RF transceiver integrated circuit 102 appropriately.

Figure 2:
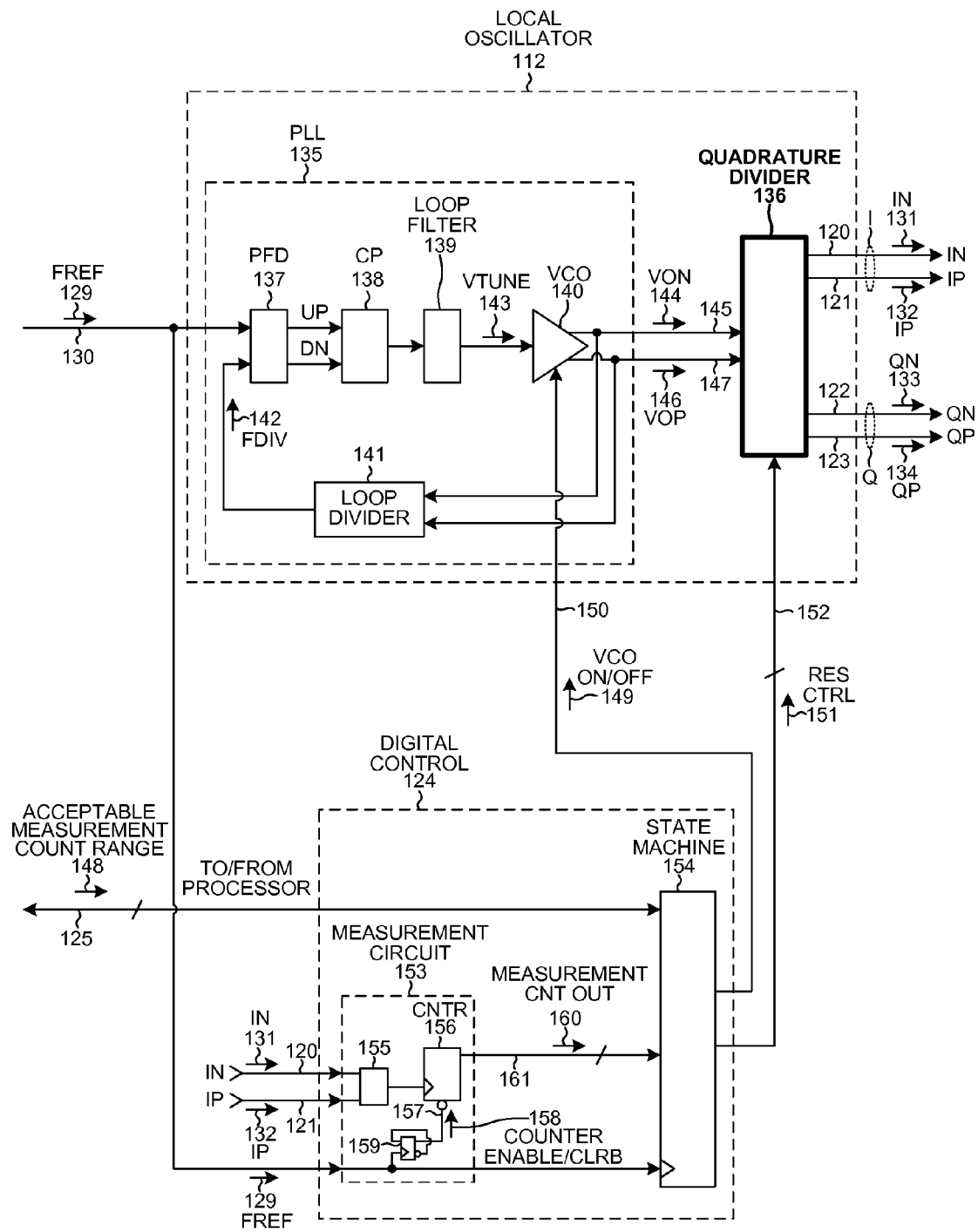
FIG. 2 is a block diagram of a local oscillator 112 and a digital control circuit 124 of FIG. 1.

FIG. 2 is a block diagram of local oscillator 112 and digital control circuit 124 of FIG. 1. Local oscillator 112 receives a reference clock signal FREF 129 on conductor 130, and outputs the In-Phase differential signals IN 131 and IP 132 on conductors 120 and 121, and the Quadrature-Phase differential signals QN 133 and QP 134 on conductors 122 and 123. The I signal is a differential signal, and the Q signal is a differential signal. The local oscillator 112 includes a Phase-Locked Loop (PLL) 135 and a quadrature divider 136. There are many ways the PLL 135 can be implemented, but in the illustrated example, the PLL 135 includes a Phase Frequency Detector (PFD) 137, a Charge Pump (CP) 138, a loop filter 139, a Voltage-Controlled Oscillator (VCO) 140, and a loop divider 141. PFD 137 compares the phase of the reference clock signal FREF 129 with a feedback divider signal FDIV 142 from the loop divider 141. Depending on the relative phase of these two signals, PFD 137 generates up and down signals, UP and DN. The charge pump 138 converts the UP and DN signals into a Direct Current (DC) signal that is in turn filtered by loop filter 139 and converted into a VTUNE signal 143. VCO 140 outputs an oscillating differential signal involving signal VON 144 on conductor 145, and signal VOP 146 on conductor 147. The frequency of the VCO output signals depends on the VTUNE signal 143 supplied to the VCO 140.

The digital control circuit 124 of FIG. 2 receives an acceptable measurement count range signal 148 on conductors 125, and outputs a VCO ON/OFF signal 149 on conductor 150, as well as a resonator control signal RES CTRL 151 on conductors 152. The resonator controls signal RES CTRL 151 is a multi-bit digital control signal, and reference numeral 152 indicates multiple digital conductors. In addition, the digital control circuit 124 communicates with processor 111 of the baseband processor integrated circuit 103 by conductors 125 and the local bus mechanism 114. The digital control circuit 124 includes a measurement circuit 153 and a state machine 154. The measurement circuit 153 in the illustrated example includes a differential-to-single buffer circuit 155 that receives the differential in phase signals IN 131 and IP 132 on conductors 120 and 121, and outputs a corresponding singled-ended clock signal to the clock input lead of counter 156. The counter 156 has a clear input lead 157 coupled to receive the COUNTER ENABLE/CLRB signal 158 from toggle flip-flop 159. The counter 156 supplies a multi-bit digital parallel output MEASUREMENT CNT OUT signal 160 on conductors 161 to the state machine 154. The state machine 154 is clocked by the signal FREF 129.

Figure 3:
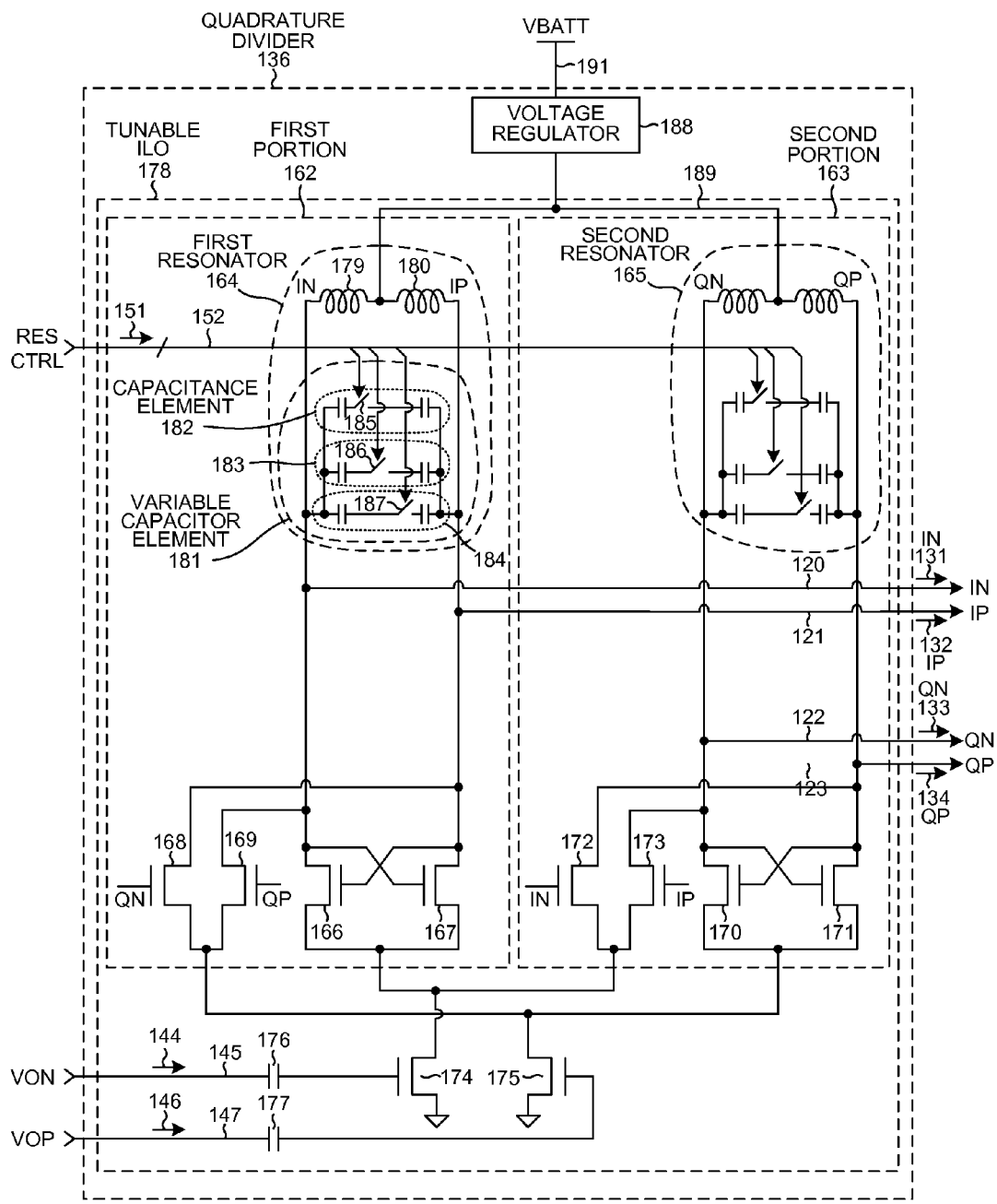
FIG. 3 is a more detailed circuit diagram of the quadrature divider circuit 136 of FIG. 2.

FIG. 3 is a more detailed circuit diagram of the quadrature divider circuit 136 of FIG. 2. The quadrature divider circuit 136 receives the multi-bit digital control signals RES CTRL 151 on conductors 152, and outputs the I and Q differential signals on conductors 120, 121, 122, and 123. The quadrature divider 136 includes first portion 162 and a second portion 163. Each of these two portions includes a resonator. Resonator 164 is the resonator for first portion 162. Resonator 165 is the resonator for second portion 163. The first portion 162 further includes cross-coupled transistors 166 and 167, as well as quadrature signal injection transistors 168 and 169 having gates that receive signals QN 133 and QP 134, respectively. Similarly, the second portion further includes cross-coupled transistors 170 and 171, as well as quadrature signal injection transistors 172 and 173 having gates that receive signals IN 131 and IP 132, respectively. The first and second portions 162 and 163, together along with N-channel transistors 174 and 175, and coupling capacitors 176 and 177 constitute an Injection-Locked Oscillator (ILO) 178. The ILO 178, as illustrated in FIG. 3, is a conventional ILO except for the variable nature of capacitances within the resonators, and typically includes biasing circuitry (not shown) that biases N-channel transistors 174 and 175. The first portion 162 and second portion 163 oscillate at the same frequency, but output signals I and Q that are ninety degrees out phase with respect to each other.

A natural oscillating frequency of resonators 164 and 165 can be adjusted such that the ILO 178 can lock to a PLL 135 output signal that is variable over a wide frequency range. The resonators 164 and 165 include inductive elements and capacitive elements coupled in parallel. Resonator 165 is of substantially the same structure as resonator 164. In the illustrated example, the inductive elements of resonator 164 are inductor 179 and inductor 180. The capacitive element is a digitally-controlled variable capacitor element 181. The variable capacitor element 181 is a network of parallel-connected capacitance elements 182, 183, and 184 (identified by the dotted circles). Each capacitance element includes two capacitors and a switch. The switches 185-187 are controlled by digital control bits of the resonator control multi-bit digital control signal RES CNTRL 151 to selectively switch in or switch out capacitance elements 182-184 thereby varying the capacitance of the variable capacitor 181. In this example, the capacitors of resonators 164 and 165 have a binary weighted sizing of 10-femtofarad granularity and can be calibrated to have capacitances between approximately 0-femtofarads and 150-femtofarads (for example, 10-femtofarads, 20-femtofarads, 30 femtofarads, . . . , 150 femtofarads). The capacitances listed above assume ideal switches and capacitors. In this way, the state machine 154 of the digital control circuit 124 can change the capacitances of the resonators 164 and 165, and therefore the natural oscillating frequency of the resonators by changing a value of the resonator control signal RES CNTRL 151. The quadrature divider 136 advantageously can operate at a low supply voltage. A supply regulator 188 receives an unregulated battery voltage of 1.3V from battery supply conductor 191 and supplies the ILO 178 with a regulated 0.7V DC supply voltage on supply conductor 189. Although the resonators 164 and 165 of the ILO 178 may be relatively high Q resonators, their natural oscillating frequencies are controllable and adjustable by the state machine 154 of the digital control circuit 124. In this way, processor 111 can adjust the natural oscillating frequency of the resonators 164 and 165 such that the ILO 178 can lock to a PLL 135 output signal that is variable over a wide frequency range such that the ILO 178 is usable as a local oscillator in a wideband wireless receiver while still obtaining advantages attendant in an ILO of relatively low power and phase noise.

Figures 4, 5:
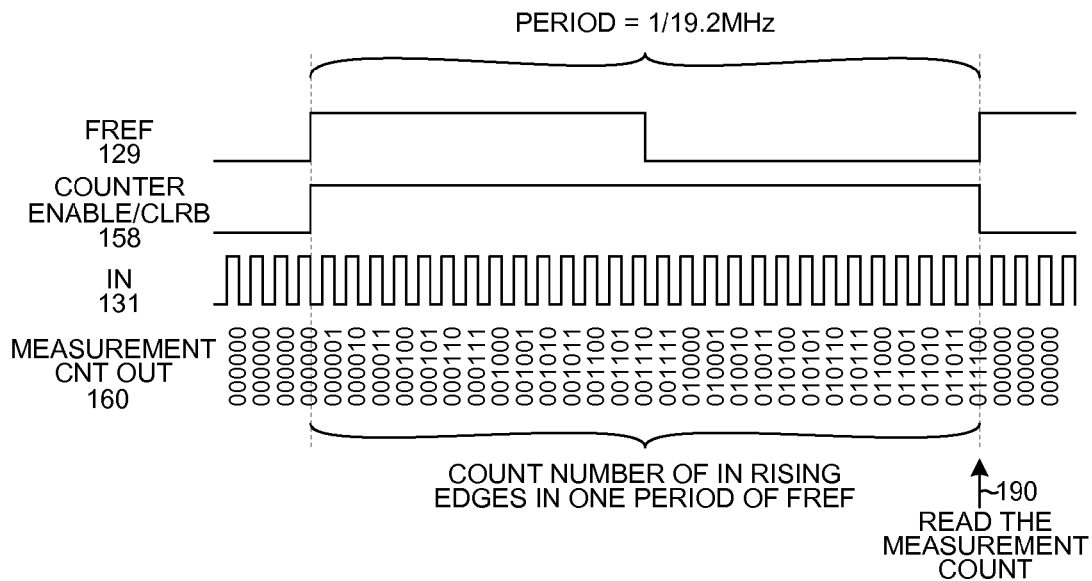
FIG. 4 is simplified waveform diagram that illustrates how the digital control circuit 124 can make a measurement indicative of the natural oscillating frequency of the ILO 178.
FIG. 5 is a table that illustrates how the ILO resonator is tuned in different operating conditions of the wireless transceiver 100 of FIG. 1.

FIG. 4 is a simplified waveform diagram that illustrates how the digital control circuit 124 can make a measurement indicative of the natural oscillating frequency of the ILO 178. The counter 156 of the measurement circuit 153 is cleared when the COUNTER ENABLE/CLRB signal 158 is low. The counter starts counting on the rising edge of the COUNTER ENABLE/CLRB signal 158 and counts rising edges of the In-Phase signal (represented here by signal IN 131) and this counting of edges continues for one complete period of the signal FREF 129 and concludes at the time indicated by arrow 190, at the falling edge of COUNTER ENABLE/CLRB signal 158. The number of edges is recorded in the digital value of the MEASUREMENT CNT OUT signal 160 on conductors 161 of FIG. 2. At the same time, the state machine 154 reads the measurement count and uses the measurement value to determine whether or not to adjust the natural oscillating frequency of the ILO 178 of FIG. 3.

FIG. 5 is a table that illustrates how the ILO resonator is tuned in different operating conditions of the wireless transceiver 100 of FIG. 1. In this example, the wireless transceiver 100 is operable in either the 802.11(a) band and 802.11(b) band, and in each of these bands the transceiver 100 can operate in a selectable one of various different channels. In the table of FIG. 5, the band is indicated in the left column and channel is indicated in the middle column of the table. For each combination of band and channel, the ILO resonator tuning table of FIG. 5 that is stored in memory 127 of the baseband processor integrated circuit 103 includes data indicating an acceptable measurement count range. Each of these count ranges includes a first count value that indicates a low value of the count range and a second count value that indicates an upper value of the count range. The processor 111 of the baseband processor integrated circuit 103 determines the band and channel to be used as the wireless transceiver 100 operates and looks up and supplies the acceptable measurement count range information 148 via the local bus mechanism 114 to the digital control circuit 124 of FIG. 1 so that the digital control circuit 124 can in turn adjust the natural oscillating frequency of the local oscillator 112 appropriately. In this way, even though the resonators 164 and 165 of the ILO 178 may be relatively high Q resonators so that the ILO 178 has a relatively narrow frequency locking range, the processor 111 can adjust the natural oscillating frequency by changing the capacitance in the resonators 164 and 165 such that the narrow locking range corresponds to the VCO output signal required for communication in the necessary band and channel.

Figure 6:
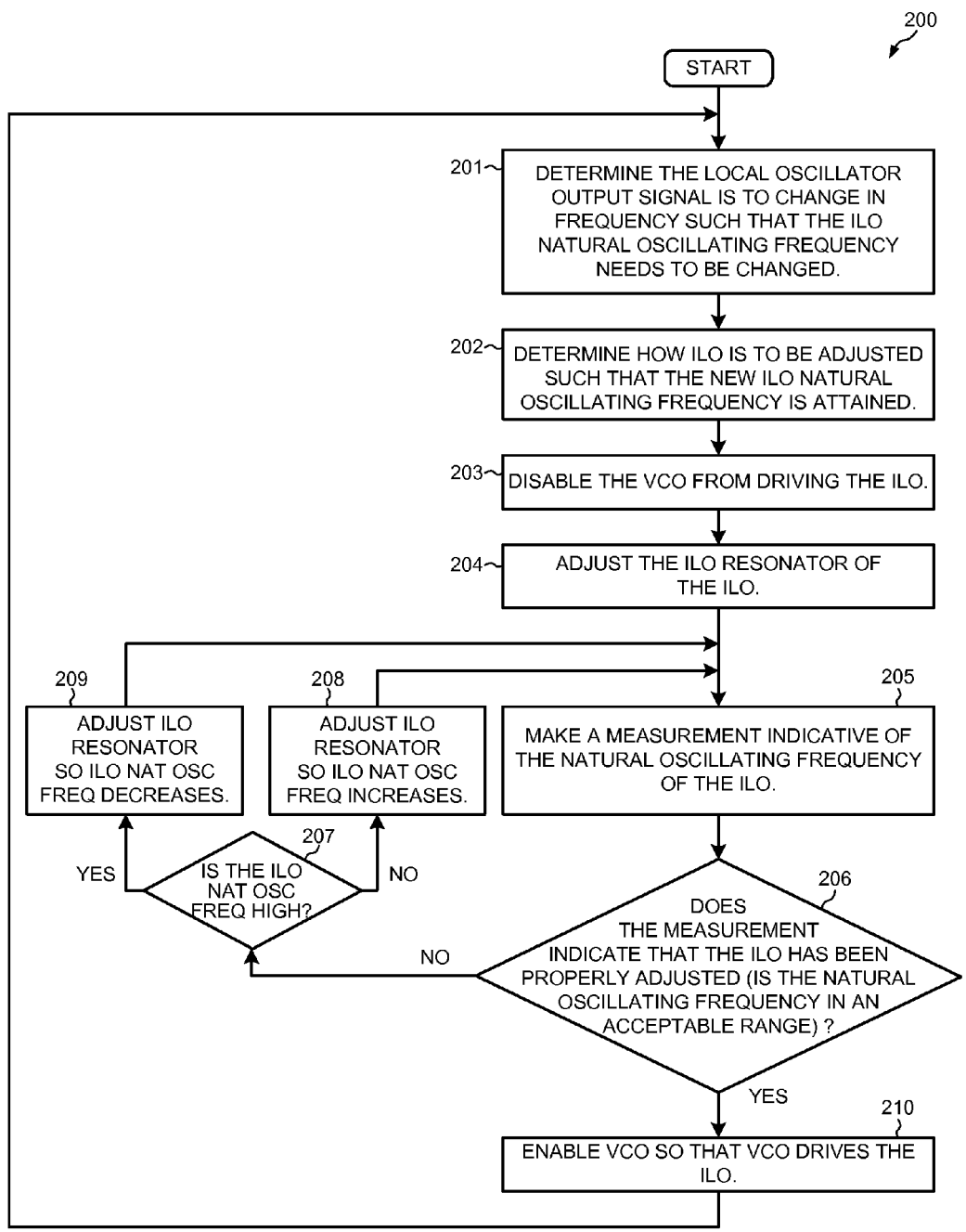
FIG. 6 is a simplified flowchart of an operation of the wireless transceiver 100 of FIG. 1 in accordance with one aspect.

FIG. 6 is a simplified flowchart of an operation of the wireless transceiver 100 of FIG. 1 in accordance with one novel aspect. A processor of the wireless transceiver determines (step 201) that the local oscillator output signal is to change in frequency in such a way that the ILO natural oscillating frequency will be changed. The processor then determines how the ILO is to be adjusted (step 202) such that the new ILO natural oscillating frequency is obtained. For example, the processor 111 may determine based on the band and channel to be used in a communication what the corresponding acceptable measurement count range is by reading the ILO resonator tuning table 128 from memory 127, and then communicating the count values indicating the measurement count range to the state machine 154 of the digital control circuit 124. Next, the state machine 154 of the digital control circuit 124 disables the VCO 140 (step 203) from driving the ILO 178. In one example, the state machine 154 disables the VCO 140 from driving the ILO 178 by asserting VCO ON/OFF signal 149 on conductor 150 so that the VCO 140 no longer outputs an oscillating signal. Because the output of the VCO 140 is AC coupled to signal injection N-channel transistors 174 and 175 of FIG. 3 by AC coupling capacitors 176 and 177, the fact that the VCO output signal no longer oscillates prevents the VCO 140 from changing the conductance of the N-channel transistors 174 and 175 and therefore prevents the VCO 140 from affecting the resonance of the ILO 178. Next, the state machine adjusts the ILO resonator (step 204) of the ILO so that the natural oscillating frequency of the resonators is adjusted to be closer to the natural oscillating frequency required according to the band and channel selected. For example, this is done by changing the resonator control digital signal RES CTRL 151 and changing the capacitances of the variable capacitance elements in the resonators 164 and 165. Next, the measurement circuit in the digital control circuit makes a measurement (step 205) indicative of the natural oscillating frequency of the ILO. As explained above in connection with FIG. 4, this may involve counting the number of rising edges of the In-Phase signal that occur in a fixed amount of time such as in one period of the reference clock signal FREF 129. In the present example, the signal FREF 129 has a precise frequency and is generated and received from a crystal oscillator oscillating at 19.2 MHz. Once the measurement is made, the state machine determines (step 206) whether the measurement indicates whether the ILO has been properly adjusted. If the measure indicates that the ILO has not been properly adjusted, (for example, the measurement count is not in the acceptable measurement count range 148 received by the state machine 154 from the processor 111) then processing proceeds to step 207. If the state machine determines that the ILO natural oscillating frequency is high (step 207), then the state machine adjusts the ILO resonator (step 209) so that the ILO natural oscillating frequency decreases. This involves increasing the amount of capacitance of the variable capacitor elements. On the other hand, if the ILO natural oscillating frequency is determined not to be high (step 207), then the state machine adjusts the ILO resonator so that the natural oscillating frequency increases (step 208). Regardless of whether the ILO natural oscillating frequency has been increased or decreased in steps 208 or 209, processing returns to step 205. The measurement circuit 153 of the digital control circuit 124 makes another measurement indicative of the natural oscillating frequency of the ILO (step 205) and processing proceeds to step 206. In this way the digital control signal iteratively adjusts the natural oscillating frequency of the resonators of the ILO until the measurement indicates that the ILO has been properly adjusted (step 206). If the state machine determines that the ILO has been properly adjusted, (for example, the value of MEASUREMENT CNT OUT 160 falls within the acceptable measurement count range looked up from table 128), then the digital control signal enables the VCO (step 210) so that the VCO again drives the ILO.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. In one example, a program of processor executable instructions is program 126 stored in memory 127 of FIG. 1, and memory 127 is a processor readable medium that stores the instructions.

Although certain specific embodiments are described above for instructional purposes, the teachings of this patent document have general applicability and are not limited to the specific embodiments described above. The tunable ILO may be used in other types of transceivers and is not limited to use in the Wi-Fi transceiver of FIG. 1. In one example, the tunable ILO is part of a wireless transceiver that operates in a different frequency band than Wi-Fi. In another example, the tunable ILO is part of a transceiver (without an antenna) used for a wireline application. There are several different types of resonators and they can be adjusted in different ways. In one example, the natural oscillating frequency of the resonator is adjusted by changing the capacitance of a varactor within the resonator by changing a voltage level. In another example, the natural oscillating frequency of the resonator can be adjusted by changing an inductance in the resonator. In yet another example, the resonator is constructed using Rotating Metal On Metal (RTMOM) capacitors. Furthermore, switches in a variable capacitor element of an ILO resonator are not limited to the configuration of FIG. 3, and the switches may be constructed with P-channel field-effect transistors, N-channel field effect transistors, or transmission gates. Additionally, the counter that makes the "MEASUREMENT CNT OUT" measurement of FIG. 4 may measure through a prescaler, where the prescaler is part of the loop divider of a PLL. In that case, differential signals IN and IP as output from the quadrature divider (ILO) are inputs to the prescaler, not VOP and VON from the VCO (as illustrated in FIG. 2.). The signal output by the prescaler is an input signal to the counter that outputs the "MEASUREMENT COUNT OUT" of FIG. 4. There are also different types of state machines and different ways of constructing them, and the state machine 154 of FIG. 2 is but one type. In one example, the state machine is a hardwired, dedicated state machine. In another example, the state machine is a processor that executes instructions. Accordingly, various modifications, adaptations, and combinations of the various features of the described specific embodiments can be practiced without departing from the scope of the claims that are set forth below.

What is claimed is:

1. A method comprising:
disabling a Voltage-Controlled Oscillator (VCO) from driving an Injection-Locked Oscillator (ILO) in response to detecting an impending change to a communication channel from a first communication channel to a second communication channel;
after disabling the VCO from driving the ILO, adjusting a first oscillating frequency of a first output signal of a first resonator of the ILO and adjusting a second oscillating frequency of a second output signal of a second resonator of the ILO;
after adjusting the first oscillating frequency and adjusting the second oscillating frequency, measuring a value that indicates the first oscillating frequency;
accessing a table to identify an acceptable measurement count range that corresponds to the second communication channel; and
determining whether the measured value is within the acceptable measurement count range that corresponds to the second communication channel.

2. The method of claim 1, wherein adjusting the first oscillating frequency comprises changing a capacitance of the first resonator or an inductance of the first resonator.

3. The method of claim 2, wherein the capacitance is based on a capacitor bank within the first resonator, a varactor within the first resonator, or a combination thereof.

4. The method of claim 1, wherein measuring the value comprises counting a number of edges of an output signal of the ILO, and wherein the number of edges is counted during a particular period of time.

5. The method of claim 1, further comprising when the measured value is not within the acceptable measurement count range, iteratively adjusting the first oscillating frequency and measuring the value until the measured value is determined to be within the acceptable measurement count range.

6. The method of claim 1, wherein the ILO is included in a quadrature divider, wherein the first output signal is an in-phase output signal, wherein the second output signal is a quadrature-phase output signal, and wherein the first oscillating frequency and the second oscillating frequency are smaller than an output frequency of an output signal of the VCO.

7. The method of claim 6, wherein each of the first oscillating frequency and the second oscillating frequency is approximately one third of the output frequency or approximately one quarter of the output frequency.

8. The method of claim 1, wherein the acceptable measurement count range establishes a low count value and a high count value, the low count value and the high count value corresponding to frequency limits of the second communication channel.

9. The method of claim 1, further comprising:
providing the acceptable measurement count range to digital control circuitry, wherein the digital control circuitry determines whether the measured value is within the acceptable measurement count range, wherein the table stores a plurality of acceptable measurement count ranges, and wherein each acceptable measurement count range of the plurality of acceptable measurement count ranges corresponds to a different communication channel.

10. The method of claim 1, wherein the table includes a plurality of entries, and wherein each entry of the plurality of entries includes a corresponding communication band field, a corresponding communication channel field, and a corresponding acceptable measurement count range field.

11. The method of claim 10, wherein the plurality of entries includes a first group of entries and a second group of entries, wherein the first group of entries corresponds to a first communication band, wherein the second group of entries corresponds to a second communication band, and wherein each channel identified in the first group of entries corresponds to the first communication band.

12. The method of claim 1, further comprising, based on a determination that the measured value is within the acceptable measurement count range, enabling the VCO to drive the ILO.

13. The method of claim 1, wherein, in response to disabling the VCO from driving the ILO, the first oscillating frequency and the second oscillating frequency are adjusted to a first frequency value based on the second communication channel.

14. The method of claim 13, wherein the first frequency value is a particular fraction of a second frequency value of an output signal of the VCO when the measured value is within the acceptable measurement count range.

15. A circuit comprising:
an Injection-Locked Oscillator (ILO);
a Voltage-Controlled Oscillator (VCO) configured to drive the ILO; and
a control circuit configured to:
selectively disable the VCO from driving the ILO in response to detecting an impending change to a communication channel from a first communication channel to a second communication channel;
access a table to identify an acceptable measurement count range that corresponds to the second communication channel; and
after selectively disabling the VCO from driving the ILO, adjust a first oscillating frequency of a first output signal of a first resonator of the ILO and adjust a second oscillating frequency of a second output signal of a second resonator of the ILO until a measured value that indicates the first oscillating frequency is within the acceptable measurement count range.

16. The circuit of claim 15, wherein the control circuit further comprises:
a digital counter configured to count a number of edges of the first output signal to determine the measured value, wherein the number of edges is counted during a period of time, and wherein the measured value is indicated by a multi-bit digital output of the digital counter; and
a state machine configured to determine whether the multi-bit digital output is within the acceptable measurement count range, wherein the state machine is a hardwired state machine.

17. The circuit of claim 16, wherein the state machine is configured to output a digital control signal, and wherein the digital control signal is configurable to control a first capacitance of the first resonator and to control a second capacitance of the second resonator.

18. The circuit of claim 15, further comprising:
a digital processor coupled to the control circuit, wherein the digital processor is configured to execute instructions to send digital information to the control circuit based on the impending change to the communication channel, wherein the communication channel is used by a transceiver that includes the VCO and the ILO, and wherein the digital information includes the acceptable measurement count range.

19. The circuit of claim 15, wherein the control circuit is configured to enable the VCO to drive the ILO based on a determination that the measured value is within the acceptable measurement count range.

20. An apparatus comprising:
  means for injection-locking an oscillating signal;
  means for outputting a voltage-controlled oscillating signal that is configured to drive the means for injection-locking the oscillating signal; and
  means for adjusting the oscillating signal, the means for adjusting comprising:
    means for selectively disabling the means for outputting the voltage-controlled oscillating signal in response to detecting an impending change to a communication channel from a first communication channel to a second communication channel; and
    means for adjusting a first oscillating frequency of a first output signal of a first resonator within the means for injection-locking the oscillating signal and adjusting a second oscillating frequency of a second output signal of a second resonator within the means for injection-locking the oscillating signal, wherein the first oscillating frequency and the second oscillating frequency are adjusted after selectively disabling the means for outputting the voltage-controlled oscillating signal;
    means for measuring a value that indicates the first oscillating frequency;
    means for identifying an acceptable measurement count range that corresponds to the second communication channel; and
    means for determining whether the measured value is within the acceptable measurement count range.

21. The apparatus of claim 20, wherein the measured value indicates a number of edges of the first output signal.

22. A non-transitory computer readable medium storing instructions that, when executed by a processor, cause the processor to:
  disable a Voltage-Controlled Oscillator (VCO) from driving an Injection-Locked Oscillator (ILO) in response to detecting an impending change to a communication channel from a first communication channel to a second communication channel;
  after disabling the VCO from driving the ILO, adjust a first oscillating frequency of a first output signal of a first resonator of the ILO and a second oscillating frequency of a second output signal of a second resonator of the ILO;
  after adjusting the first oscillating frequency and the second oscillating frequency, measure a value that indicates the first oscillating frequency;
  access a table to identify an acceptable measurement count range that corresponds to the second communication channel; and
  determine whether the measured value is within the acceptable measurement count range.

\* \* \* \* \*